United States Patent
Lu et al.

(10) Patent No.: US 7,332,422 B2
(45) Date of Patent: Feb. 19, 2008

(54) METHOD FOR CUO REDUCTION BY USING TWO STEP NITROGEN OXYGEN AND REDUCING PLASMA TREATMENT

(75) Inventors: Wei Lu, Singapore (SG); Loh Nah Luona Goh, Singapore (SG); Liang Choo Hsia, Singapore (SG)

(73) Assignee: Chartered Semiconductor Manufacturing, Ltd., Singapore (SG)

(*) Notice: Subject to any disclaimer, the term of this patent is extended or adjusted under 35 U.S.C. 154(b) by 315 days.

(21) Appl. No.: 11/029,881

(22) Filed: Jan. 5, 2005

(65) Prior Publication Data
US 2006/0148255 A1    Jul. 6, 2006

(51) Int. Cl.
*H01L 21/44* (2006.01)

(52) U.S. Cl. .................. 438/597; 428/430; 428/677; 428/687; 257/E21.575

(58) Field of Classification Search ................ 438/597, 438/430, 687, 677; 257/E21.575
See application file for complete search history.

(56) References Cited

U.S. PATENT DOCUMENTS

| | | | |
|---|---|---|---|
| 5,913,144 A | 6/1999 | Nguyen et al. | |
| 6,624,045 B2* | 9/2003 | Liang et al. | 438/430 |
| 6,764,950 B2 | 7/2004 | Noguchi et al. | |
| 6,764,951 B1 | 7/2004 | van Ngo | |
| 7,094,705 B2* | 8/2006 | Lin et al. | 438/710 |
| 7,193,325 B2* | 3/2007 | Wu et al. | 257/760 |
| 2001/0030367 A1 | 10/2001 | Noguchi et al. | |
| 2002/0123218 A1* | 9/2002 | Shioya et al. | 438/635 |
| 2004/0007779 A1* | 1/2004 | Arbuthnot et al. | 257/780 |
| 2004/0152333 A1 | 8/2004 | Zhao et al. | |
| 2005/0048798 A1* | 3/2005 | Bojkov et al. | 438/784 |
| 2005/0158999 A1* | 7/2005 | Lin et al. | 438/687 |

OTHER PUBLICATIONS

"Adhesion Quantification of Pos-CmP Cu to amorphous SiN passivation by NanoIndentation", by Vella et al., Mat. REs. Soc. Symp. Proc. vol. 649 2001 Materials research Society; pp. Q6.1.1Q.6.1.6.

* cited by examiner

*Primary Examiner*—Michael Lebentritt
*Assistant Examiner*—Stanetta Isaac
(74) *Attorney, Agent, or Firm*—Horizon IP Pte Ltd

(57) ABSTRACT

A method for cleaning a copper interconnect after a chemical-mechanical polishing that comprises: a) treating the surface of said copper interconnect with a nitrogen and oxygen containing treatment; and b) without breaking vacuum, treating the copper interconnect with a $NH_3$ or $H_2$ plasma treatment. Next a cap layer is formed over the copper interconnect.

12 Claims, 3 Drawing Sheets

METHOD FOR CUO REDUCTION BY USING TWO STEP NITROGEN OXYGEN AND REDUCING PLASMA TREATMENT

BACKGROUND OF INVENTION

1) Field of the Invention

The present invention relates to a fabrication method of a semiconductor integrated circuit device, particularly to a technique effective when applied to formation of inlaid interconnects by chemical mechanical polishing (CMP) and more particularly to a method for cleaning Cu containing metal after a chemical-mechanical polish (CMP) process.

2) Description of the Prior Art

In a technique for forming interconnections comprising semiconductor integrated circuit devices, semiconductor devices, electronic circuit devices and electronic devices, a conducting film, such as, for example, aluminum or tungsten, is deposited over an insulating film and is patterned by ordinary photolithography and dry etching.

However, in this interconnection forming technique, as devices and interconnections comprising semiconductor integrated circuit devices become finer, interconnection resistances are largely increasing, interconnection delays are occurring, and a limit is being reached to further performance improvements of the semiconductor integrated circuit devices.

In recent years, an interconnection forming technique known as the Damascene method has been developed. This Damascene method may be broadly distinguished into two types, i.e., the Single Damascene method and the Dual Damascene method.

In the single damascene method, after forming an interconnection slot in an insulating film, for example, a main conducting layer for forming interconnections is deposited over this insulating film and in the interconnection slot, and an embedded interconnection in the interconnection slot is formed by polishing this main conducting layer by, for example, CMP (Chemical Mechanical Polishing), so that it is left only in the interconnection slot.

In the Dual Damascene method, after forming a connecting hole to connect with the interconnection slot and a substrate interconnection in the insulating film, a main conducting layer for forming interconnections is deposited over this insulating film and in the interconnection slot and connecting hole, and an embedded interconnection in the interconnection slot and the connecting hole is formed by polishing this main conducting layer by, for example, CMP (Chemical Mechanical Polishing), so that it is left only in the interconnection slot and connecting hole.

In both methods, a material such as copper or the like is used as the material of the main conducting layer of the interconnections from the viewpoint of improving the performance of the semiconductor integrated circuit device. Copper has the advantage that, compared to aluminum, its resistance is lower and its permitted current for reliability is more than two orders of magnitude higher. Hence, the film can be made thinner to obtain the same interconnection resistance, and the capacitance between adjacent interconnections can be reduced.

However, copper interconnects used in CMP processes have problems.

Relevant patent and technical literature are as follows.

U.S. Pat. No. 6,764,950B2 Noguchi, et al. and US 20010030367 A1—Noguchi, Junji; et al. Oct. 18, 2001—Semiconductor integrated circuit device and fabrication method for semiconductor integrated circuit device.

US 20040152333 A1—Zhao, Larry; et al. Aug. 5, 2004—Dielectric barrier layer for a copper metallization layer having a varying silicon concentration along its thickness.

U.S. Pat. No. 6,764,951 van Ngo Jul. 20, 2004—Method for forming nitride capped Cu lines with reduced hillock formation.

"Adhesion Quantification of Pos-CmP Cu to amorphous SiN passivation by NanoIndentation", by Vella et al., pp. Q6.1.1Q.6.1.6, discusses Cu treatments.

U.S. Pat. No. 5,913,144 Nguyen, et al.—Oxidized diffusion barrier surface for the adherence of copper and method for same.

SUMMARY OF THE INVENTION

The embodiments of the present invention provide a fabrication method of a semiconductor integrated circuit device, particularly to a technique effective when applied to formation of inlaid interconnects by chemical mechanical polishing (CMP) and The embodiments of the present invention provide a fabrication method for plasma treating/cleaning Cu containing metal after a chemical-mechanical polish (CMP) process.

An example embodiment is a method of fabrication of a copper interconnect comprises the steps of:
 providing a semiconductor structure comprised of a copper interconnect and a dielectric layer over a semiconductor substrate;
 chemical-mechanical polishing said copper interconnect to planarize said copper interconnect;
 treating the surface of said copper interconnect with a nitrogen and oxygen containing treatment;
 without breaking vacuum, treating the copper interconnect with reducing plasma treatment;
 without breaking vacuum, forming a capping layer over the copper interconnect.

Other example embodiments are described in the specification below.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming and cleaning a copper interconnect.

A. Semiconductor Structure—Copper Interconnect

Figure 1:
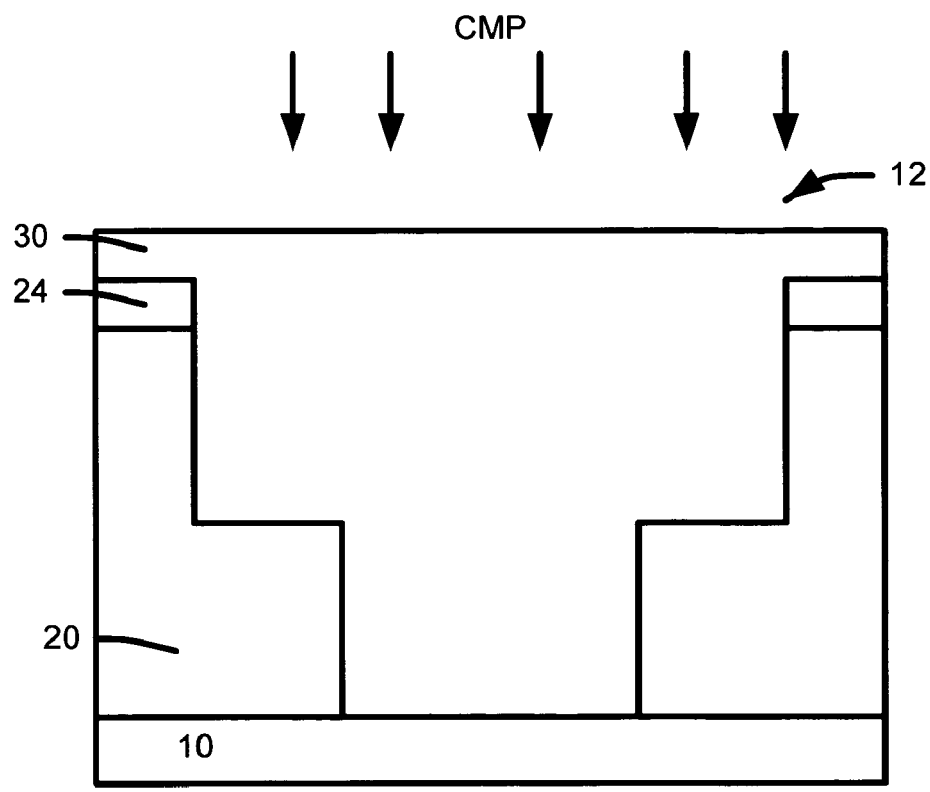
FIGS. 1 through 4 are cross sectional views for illustrating a method for plasma treating/cleaning Cu containing metal after a chemical-mechanical polish (CMP) process according to an example embodiment of the present invention.

Referring to FIG. 1, we provide a semiconductor structure 12 comprised of a copper interconnect (layer) 30 and a dielectric layer 20 24 over a semiconductor substrate 10 (or wafer 10).

A optional stop layer 24 is formed over the dielectric layer 20. The optional stop layer 24 could also be formed over the copper layer. The stop layer 24 can be comprised of SiN.

The copper interconnect is comprised of copper and may have other alloys or impurities. The copper interconnect can be an inlaid interconnect or inlaid metal interconnect.

B. Chemical-mechanical Polish

Figure 2:
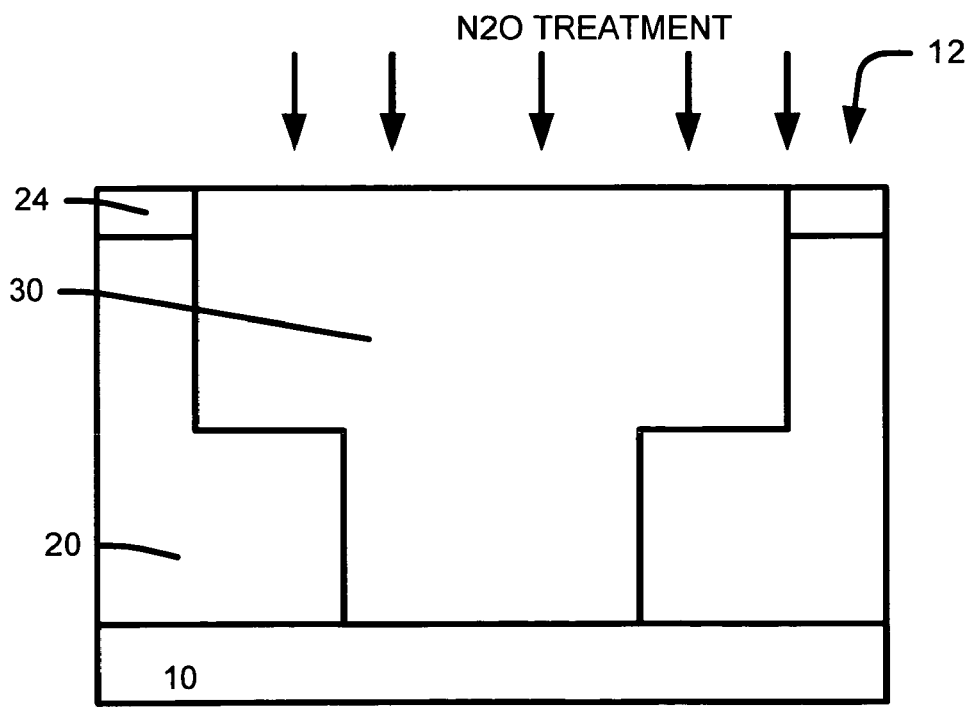

Referring to FIGS. 1 and 2, we chemical-mechanical polish (CMP) the copper interconnect layer to planarize the copper interconnect 30.

After chemical-mechanical polish (CMP) there normally is a CuO layer formed on top of the Cu. To prevent the excessive oxidation and Cu Corrosion, the organic materials like BTA are used to cap the surface first and then the embodiments' treatment is needed to cap the reduce the CuO layer to Cu.

Next, we clean the surface of the semiconductor structure 12. The clean can be a chemical (e.g., BTA) or mechanical clean. After this clean, the embodiment's 2 step treatment process is preferably performed.

C. Treating the Surface of the Copper Interconnect with a Nitrogen and Oxygen Containing Treatment Next, referring to FIG. 2, we treat the surface of the copper interconnect 30 with a nitrogen and oxygen containing (e.g., $N_2O$, $N_xO_y$,) treatment.

The $N_2O$ treatment preferably comprises about:
N₂O flow between 1000 and 5000 sccm and about 1580 and 1620 sccms and more preferably of about 1600 sccms;
a HF RF (high frequency RF) power between 200 and 400 W; between 220 and 250 W; and more preferably 235 W;
a LF RF (Low frequency RF) power between 50 and 150 W and more preferably between 90 and 110 W more preferably about 75 W;
a pressure between 1.5 and 4.5 torr and more preferably between 2.0 and 2.4 torr and more preferably 2.2 torr.;
a treatment time between 10 and 20 seconds and between 13 and 17 sec; and more preferably 15 sec;
a temperature between 350 and 450 C and between 390 to 410 C and more preferably about 400 C;
a wafer size of preferably 200 nm;
using a ICP plasma type reactor.

An example of a reactor that this step is performed in is a Sequel (ICP) reactor, model C2 by Novellus company The nitrogen and oxygen containing plasma treatment removes the organic residual and at the same time continues to grow a thin CuO layer on the Cu which saturates at certain thickness of typically between 100 and 300 angstroms. After CMP, the Cu surface exposed to ambient that contains oxygen.

The wafer is next treated with the embodiment's plasma treatment in-situ (without breaking vacuum and exposing the wafer to air).

D. Treating the Copper Interconnect with a Reducing Plasma Treatment

Figure 3:
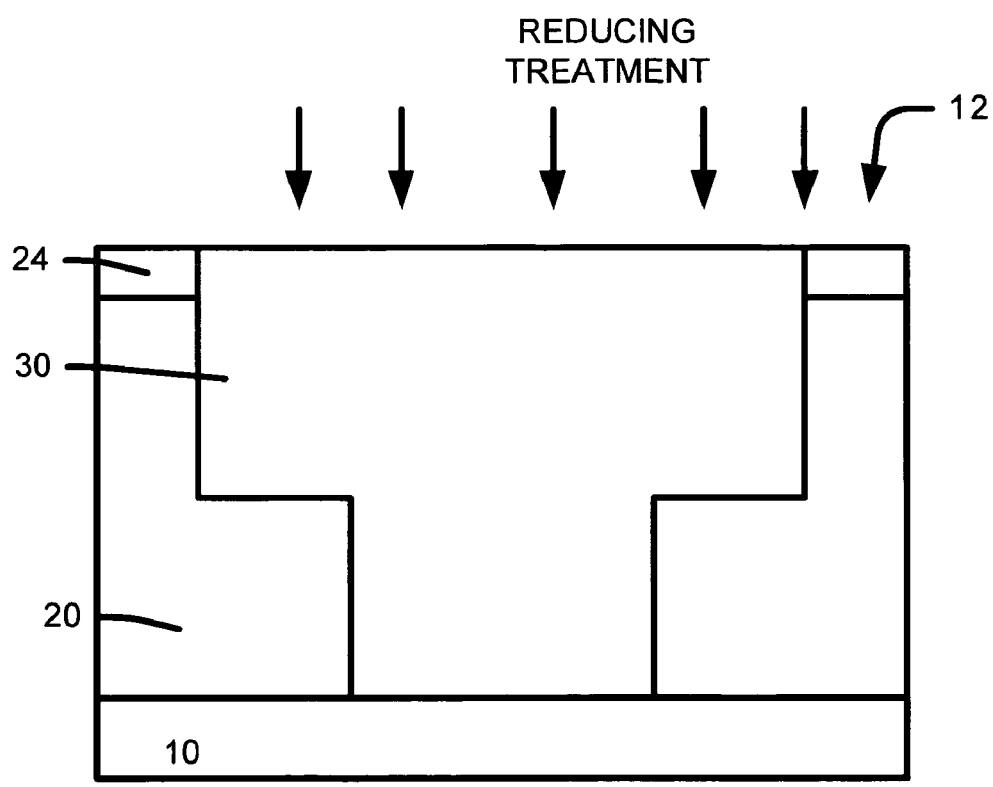

Referring to FIG. 3, next, preferably without breaking vacuum and in-situ, treating the copper interconnect with a plasma of a reducing atmosphere such as $NH_3$ or $H_2$ plasma treatment.

The 2$^{nd}$ Step: $NH_3$ or $H_2$ treatment reduces the CuO to Cu. During this treatment, there is only pure CuO, so it can be treated uniformly. Below are reactions.

$$CuO+H_2 <=> Cu+H_2O \tag{1}$$

$$CuO+NH_3 <=> Cu+H_2O+N_2 \tag{2}$$

The $NH_3$ treatment preferably comprises about:
N2 flow between 1000 and 5000 sccm and between 1500 and 1700 sccms; and more preferably of about 1600 sccms;
$NH_3$ flow between 2000 and 5600 sccm and between 3900 and 4100 sccms and more preferably of about 4000 sccms;
a HF RF power between 200 and 400 W and between 225 and 245 W and more preferably 235 W;
a LF RF power between 50 and 150 W and between 50 and 150 W and more preferably about 75 W;
a pressure between 1.5 and 4.5 torr and between 2.0 and 2.4 torr; and more preferably 2.2 torr;
a treatment time between 10 and 20 seconds and between 13 and 17 seconds and more preferably 15 sec;
a temperature between 350 and 450 C and more preferably between 390 and 410 C and more preferably about 400 C;
a wafer size of preferably 200 nm;
using a ICP plasma type reactor.

Note any flows in the flow ratio range between the $N_2$ and the $NH_3$ can be used and the exact flow rates are not necessary. The process can be scaled up or down depending on the situation or chamber size.

An example of a reactor that this step is performed in is a Sequel (ICP type) reactor, model C2 by Novellas company.

The reducing plasma treatment is a $H_2$ treatment preferably comprises:
$H_2$ flow between 3000 and 7000 sccm and more and more preferably 1400 to 1800 sccms and more preferably of about 1600 sccms;
a HF RF power between 200 and 500 W and more preferably between 290 and 310 W and more preferably about 300 W
a LF RF power between 50 and 200 W and more preferably between 90 and 110 W more preferably about 100 W;
a pressure between 2 and 6 torr and more preferably between 3 and 5 torr and more preferably 4 torr;

a treatment time between 5 and 20 seconds and more preferably between 8 and 12 seconds and more preferably 10 sec a temperature between 350 and 450 C and more preferably between 390 and 410 C and more preferably about 400 C;

a wafer size of preferably 200 nm;

using a ICP plasma type reactor.

Figure 4:
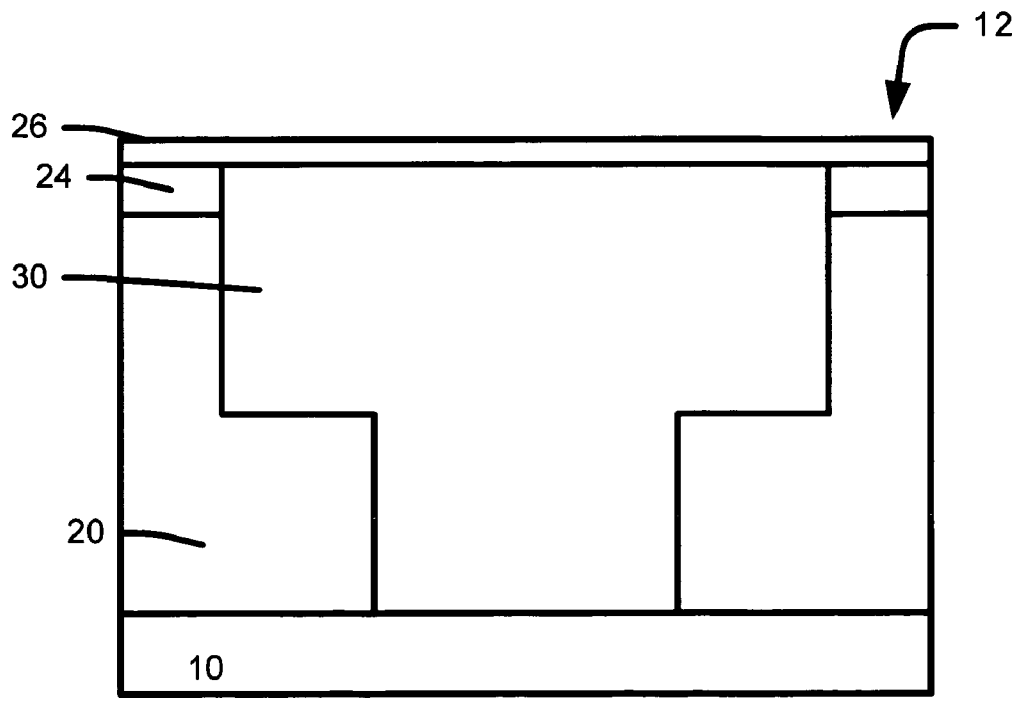

An example of a reactor that this step is performed in is a Sequel (ICP) reactor, model C2 by Novellus company E. Form Cap Layer Over Cu Referring to FIG. 4, we form a cap layer 26 over the Cu interconnect 30, preferably without breaking vacuum (in-situ).

The cap layer preferably is comprised of SiN, SiC—N (nitrogen doped SiC) or SiC—O (oxygen doped SiC).

F. Summary of Example Plasma Treatments Parameters

Example plasma treatment parameters are shown below in table 1.

TABLE 1

| N2O Treatment | Setting | Range |
|---|---|---|
| N2O | 1600 sccm | 1000-5000 |
| HF RF | 235 W | 200-400 |
| LF RF | 75 W | 50-150 |
| Pressure | 2.2 Torr | 1.5-4.5 |
| Treat Time | 15 sec | 10-20 |
| Temperature | 400 C. | 350-450 |
| wafer Size | 200 mm | |
| Plasma | ICP | |

| NH3 Treatment | Setting | Range |
|---|---|---|
| N2 | 1600 sccm | 1000-5000 |
| NH3 | 4000 sccm | 2000-6000 |
| HF RF | 235 W | 200-400 |
| LF RF | 75 W | 50-150 |
| Pressure | 2.2 Torr | 1.5-4.5 |
| Treat Time | 15 sec | 10-20 |
| Temperature | 400 C. | 350-450 |
| wafer Size | 200 mm | |
| Plasma | ICP | |

| H2 Treatment | Setting | Range |
|---|---|---|
| H2 | 5000 sccm | 3000-7000 |
| HF RF | 300 W | 200-500 |
| LF RF | 100 W | 50-200 |
| Pressure | 4 Torr | 2-6 |
| Time | 10 sec | 10-20 |
| Temperature | 400 C. | 350-450 |
| wafer Size | 200 mm | |
| Plasma | ICP | |

G. Test Results

Figure 5:
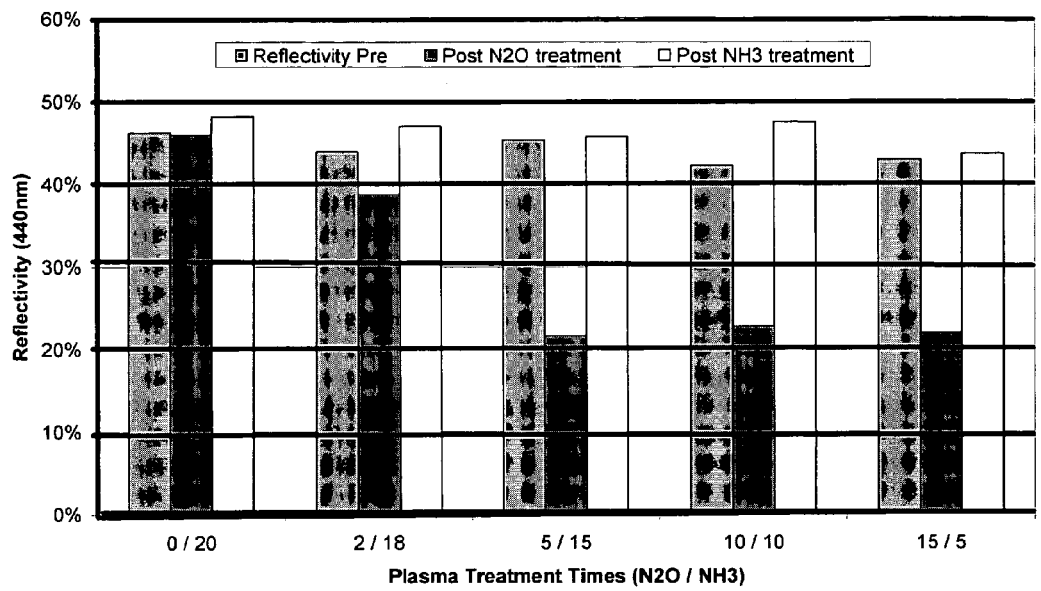
FIG. 5 shows a graph of reflectivity vs plasma treatment times at 3 times during the processes 1) post CMP clean 2) post $N_2O$ plasma treatment and 3) post $NH_3$ plasma treatment for an example embodiment process.

FIG. 5 shows a graph of reflectivity (4400 nm) vs plasma treatment times at 3 times during the processes 1) post CMP clean 2) post $N_2O$ plasma treatment and 3) post $NH_3$ plasma treatment.

The example embodiment process flow is:

form Cu layer
chemical-mechanical polish (CMP) Cu layer
1) Nitrogen and oxygen containing (e.g. $N_2O$) plasma treatment
2) $H_2$ or $NH_3$ plasma treatment
form cap layer over Cu layer The FIG. 5, graph shows the $N_2O$ and $NH_3$ treatment is the best option (time 10 sec/10 sec) is because the CuO has been fully reduced to Cu. But to make sure the uniformity treatment, the 10 sec $N_2O$/20 sec $NH_3$ option is preferred to provide more margin.

Note:
1) Incoming substrate reflectivity was 42-46%
2) $N_2O$ plasma treatment reaches saturation point within 5 seconds at ~21%
3) $NH_3$ plasma treatment recovery of saturated CuO wafers takes <10 seconds Note: Based on the reflectivity, the CuO thickness can be calibrated.

The table below summarizes some of the important steps.

TABLE

| Step | Step summary figure | Reason step is important |
|---|---|---|
| $N_2O$ treatment | 2 | removes organic and grows CuO |
| $NH_3$ or $H_2$ treatment | 3 | removes CuO |

The combination of the two plasma treatments ($N_2O$ plasma treatment and $NH_3$ or $H_2$ plasma treatment) is an improvement over using either single plasma treatment alone. Also, the embodiments preferably performs the plasma treatments in the order of (1) $N_2O$ plasma treatment and (2) $NH_3$ or $H_2$ plasma treatment, for better effectiveness.

H. Definitions

Meanings of the terms used in the description above are explained.

The term "inlaid interconnect" or "inlaid metal interconnect" usually means an interconnect patterned by a metallization technique of removing, from a conductive film embedded inside of a trench or hole formed in the insulating film, an unnecessary portion on the insulating film, as in single damascene or dual damascene. The term "single damascene" usually means an inlaid interconnect forming process wherein a plug metal and a interconnect metal are embedded in two stages. The term "dual damascene" usually means an inlaid interconnect forming process wherein a plug metal and an interconnect metal are embedded simultaneously. Copper inlaid interconnects tend to be used as a multi-level structure.

The term "semiconductor integrated circuit device" as used herein means not only a device fabricated on a single-crystal silicon substrate but also a device fabricated on another substrate such as SOI (silicon on insulator) substrate or TFT (thin film transistor) liquid crystal manufacturing substrate unless otherwise specified.

The term "wafer" means a single-crystal silicon substrate (generally in a substantially disk form), an SOS (silicon on sapphire) substrate, a glass substrate, other insulating, semi-insulating or semiconductor substrates or a composite substrate thereof, each used for manufacturing a semiconductor integrated circuit device. It also embraces a substrate, a part or whole of the substrate surface or a part or whole of the gate electrode has been made of another semiconductor such as Si or SiGe.

The term "semiconductor integrated circuit chip (semiconductor integrated circuit substrate)" or "semiconductor chip (semiconductor substrate)" means a wafer divided into unit-circuit groups after completion of a wafering step.

The term "silicon nitride" "SiN" or "silicon nitride film" means not only Si.sub.3N.sub.4 or an insulating film thereof but also a nitride of silicon having a similar composition to Si$_3$N$_4$ or an insulating film thereof.

The term "plasma treatment" means a treatment of exposing the surface of a substrate to an environment under plasma state or, if a member such as an insulating film or a metal film is formed over the substrate, exposing the surface of the member to such an environment, thereby subjecting the surface to the chemical and mechanical (bombardment) actions of the plasma. Plasma is usually generated by, while filling a reaction chamber purged with a specific gas (treatment gas) with the treatment gas as needed, ionizing the gas by the action of a high frequency field. It is however impossible to completely purge the chamber with the treatment gas. In this embodiment, therefore, the term "ammonia plasma" does not means a complete ammonia plasma but it may contain impurity gases (such as nitrogen, oxygen, carbon dioxide and vapor). Similarly, it is needless to say that the plasma may contain another dilution gas or additive gas.

The term "plasma of a reducing atmosphere" means a plasma environment in which reactive species such as radicals, ions, atoms and molecules which have a reducing action, that is, an oxygen withdrawing action, exist dominantly. These radicals or ions include atomic or molecular radicals or ions. Moreover, the environment may contain not only a single reactive species but plural reactive species. For example, the environment may having therein hydrogen radicals and NH$_3$ radicals simultaneously.

The term "chemical mechanical polishing" (CMP) means polishing of a polish surface by relatively moving it in the direction of the surface while supplying a slurry in a state where the polish surface is brought in contact with a polishing pad formed of a sheet material such as a soft cloth. In this embodiment, this term also embraces CML (chemical mechanical lapping) for polishing the polish surface by moving it relative to the surface of a hard grindstone, polishing with another fixed abrasive, and abrasive-free CMP.

I. Non-limiting Embodiments

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate different sized reactors as is known to those skilled in the art.

Unless explicitly stated otherwise, each numerical value and range should be interpreted as being approximate as if the word about or approximately preceded the value of the value or range.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a copper interconnect comprising the steps of:
    providing a semiconductor structure comprised of a copper interconnect and a dielectric layer over the semiconductor substrate, the copper interconnect having a surface;
    treating the surface of said copper interconnect with a nitrogen and oxygen containing plasma treatment under a vacuum, wherein the nitrogen and oxygen containing plasma treatment comprises
        a N$_2$O flow between about 1000 and 5000 sccm,
        a HF RF power between 200 and 400 W,
        a LF RF power between 50 and 150 W,
        a pressure between 1.5 and 4.5 torr,
        a treatment time between 10 and 20 seconds; and
        a temperature between 350 and 450 degrees C; then
    treating the copper interconnect with a reducing plasma treatment without breaking the vacuum; and
    forming a capping layer over the copper interconnect without breaking the vacuum.

2. The method of claim 1 which includes cleaning the surface of said semiconductor structure before the step of treating the surface of said copper interconnect with a nitrogen and oxygen containing plasma treatment.

3. The method according to claim 1 wherein the nitrogen and oxygen containing plasma treatment consists essentially of N$_2$O.

4. The method according to claim 1 wherein the reducing plasma treatment is a NH$_3$ plasma treatment comprising about:
    a N$_2$ flow between 1000 and 5000 sccm;
    a NH$_3$ flow between 2000 and 5600 sccm;
    a HF RF power between 200 and 400 W;
    a LP RF power between 50 and 150 W;
    a pressure between 1.5 and 4.5 torr;
    a treatment time between 10 and 20 seconds; and
    a temperature between 350 and 450 degrees C.

5. The method according to claim 1 wherein the reducing plasma treatment is a NH$_3$ plasma treatment comprising N$_2$ and NH$_3$.

6. The method according to claim 1 wherein the reducing plasma treatment is a H$_2$ plasma treatment comprising:
    a H$_2$ flow between 3000 and 7000 sccm;
    a HF RF power between 200 and 500 W;
    a LF RF power between 50 and 200 W;
    a pressure between 2 and 6 torr;
    a treatment time between 5 and 20 seconds; and
    a temperature between 350 and 450 degrees C.

7. The method according to claim 1 wherein the reducing plasma treatment is a H$_2$ plasma treatment comprising:
    a H$_2$ flow between 1400 to 1800 sccm;
    a HP RF power between 290 and 310 W;
    a LF RF power between 90 and 110 W;
    a pressure between 3 and 5 torr;
    a treatment time between 8 arid 12 seconds;
    a temperature between 390 and 410 degrees C; and
    a wafer size of about 200 nm;
    using an ICP plasma type reactor.

8. The method of claim 1, wherein the reducing plasma treatment is a NH$_3$ plasma treatment or a H$_2$ plasma treatment.

9. The method of claim 1 which further comprises, before the nitrogen and oxygen containing plasma treatment step, the step of chemical-mechanical polishing said copper interconnect to planarize said copper interconnect.

10. The method of claim 1 wherein the nitrogen and oxygen containing plasma treatment is comprised of $N_2O$.

11. A method of fabrication of a copper interconnect comprising the steps of:
   a) providing a semiconductor structure comprised of a copper interconnect and a dielectric layer over a semiconductor substrate;
   b) chemical-mechanical polishing said copper interconnect to planarize said copper interconnect;
   c) treating the surface of said copper interconnect with a nitrogen and oxygen containing plasma treatment under a vacuum to form a CuO layer on the copper interconnect;
      (1) the nitrogen and oxygen containing plasma treatment comprises:
         a $N_2O$ flow between about 1000 and 5000 sccm;
         a HF RE power between 200 and 400 W;
         a LF RE power between 50 and 150 W;
         a pressure between 1.5 and 4.5 torr;
         a treatment time between 10 and 20 seconds; and
         a temperature between 350 and 450 degrees C; then
   d) without breaking the vacuum, treating the copper interconnect with a reducing plasma treatment to remove the CuO layer from the copper interconnect;
      (1) the reducing plasma treatment is a NH3 plasma treatment comprising about:
         a $N_2$ flow between 1000 and 5000 sccm;
         a $NH_3$ flow between 2000 and 5600 sccm;
         a H RF power between 200 and 400 W;
         a LF RF power between 50 and 150 W;
         a pressure between 1.5 and 4.5 torr;
         a treatment time between 10 and 20 seconds; and
         a temperature between 350 and 450 degrees C; and
   e) without breaking the vacuum, forming a capping layer over the copper interconnect.

12. The method of claim 11 wherein treating the copper interconnect with a reducing plasma treatment is performed before forming a capping layer over the copper interconnect.

* * * * *